United States Patent [19]

Knox et al.

[11] Patent Number: 5,383,212
[45] Date of Patent: Jan. 17, 1995

[54] FREE STANDING QUANTUM WELL STRUCTURE

[75] Inventors: Wayne H. Knox, Rumson; Stephen C. Shunk, Island Heights; Michael D. Williams, Freehold; Jane E. Zucker, Aberdeen, all of N.J.

[73] Assignee: AT&T Corp., Murray Hill, N.J.

[21] Appl. No.: 100,531

[22] Filed: Jul. 30, 1993

[51] Int. Cl.⁶ .............................................. H01S 3/19
[52] U.S. Cl. ..................... 372/45; 437/129; 372/96
[58] Field of Search ............... 372/96, 45; 437/129; 257/14, 15

[56] References Cited

U.S. PATENT DOCUMENTS

| | | | |
|---|---|---|---|
| 4,949,350 | 8/1990 | Jewell et al. | 372/96 |
| 5,021,360 | 6/1991 | Melman et al. | 437/81 |
| 5,040,186 | 8/1991 | Logan et al. | 372/45 |
| 5,068,867 | 11/1991 | Hasenberg et al. | 372/45 |
| 5,088,099 | 2/1992 | Chen et al. | 372/45 |

FOREIGN PATENT DOCUMENTS 0058784  4/1983  Japan ...................... 372/96

OTHER PUBLICATIONS

Adesida, et al., Nanostructure Fabrication in InP and Related Compounds, *J. Vac. Sci. Technol.* B, vol. 8, No. 6, pp. 1357–1360, Nov./Dec. 1990.

Ho, et al., High Index Contrast Mirrors For Optical Microcavities, *Appl. Phys. Lett.*, vol. 57, No. 14, pp. 1387–1389, 1 Oct. 1990.

Deckman, et al., Microporous GaAs/GaAlAs Superlattices, *J. Vac. Sci. Technol.* B, vol. 6, No. 1, pp. 314–316, Jan./Feb. 1988.

Deckman, et al., Microfabrication of Molecular Scale Microstructures, *Appl. Phys. Lett.*, vol. 50, No. 9, pp. 504–506, 2 Mar. 1987.

*Primary Examiner*—Georgia Y. Epps

[57] ABSTRACT

Conventional microfabrication techniques in conjunction with the precise growth of layers of single crystalline materials by epitaxial growth techniques allow the creation of electro-optic microstructures which achieve high reflectivity with only few periods of layer pairs. Standard lithographic techniques are utilized to fabricate quantum wells which are confined on both sides by air, acrylic resin, or vacuum. The quantum wells are fabricated from spatially and compositionally modulated III–V superlattices in which alternate layers of the structures are sacrificed by selective etching. The structures are patterned such that the quantum wells are suspended between support posts.

19 Claims, 2 Drawing Sheets

FREE STANDING QUANTUM WELL STRUCTURE

BACKGROUND OF THE INVENTION

1. Field of the Invention

This invention relates generally to semiconductor electro-optic microstructures, and more particularly, to a quantum well arrangement wherein an air, acrylic resin, vacuum, or other barrier is utilized to achieve high reflectivity.

2. Description of the Related Art

Conventional multi-layer dielectric mirrors are formed of plural layers of materials, each such material being characterized by a respective index of refraction n. In mirrors which are formed of two materials of refractive indices $n_1$ and $n_2$, with thicknesses of $d_1$ and $d_2$, the reflectivity will, to a significant extent, scale with the difference in the refractive indices, i.e., $\Delta n = n_1 - n_2$.

A significant problem with making reflectivity mirrors from III–V semiconductors is that the difference between the respective indices of refraction is not large, and accordingly, a large number of pairs of layers is required to achieve a desired reflectivity. The problem is particularly difficult for DBR mirrors for long wavelengths, $\lambda$. For example, in order to achieve a mirror with maximum $R \sim 0.999$ in the InGaAs/InP system, some 49 pairs of layers are required. This stems from the fact that in a typical III–V system, $n_1 = 3.17$ and $n_2 = 3.5$.

It is, therefore, an object of this invention to provide an electro-optic microstructure wherein a plurality of quantum well structures are confined on both sides by a barrier having a highly contrasting index of refraction.

It is another object of this invention to provide a semiconductor electro-optic microstructure which is characterized by high reflectivity without the need for many layer pairs.

It is also an object of this invention to provide a Fabry-Perot optical resonator cavity having a linear dimension on the order of the spontaneous emission wavelength of the active medium.

It is a further object of this invention to provide a laser arrangement having a low emission threshold.

It is additionally an object of this invention to provide a semiconductor electro-optic microstructure which is characterized by high index of refraction contrast ratio and which can be fabricated with conventional fabrication techniques.

It is yet a further object of this invention to provide a Bragg mirror arrangement which achieves high reflectivity using very few layer pairs.

It is also another object of this invention to provide a tunable Bragg mirror arrangement.

SUMMARY OF THE INVENTION

The foregoing and other objects are achieved by this invention which provides a semiconductor structure having a first layer for forming a first quantum well, and a second layer forming a second quantum well. The first and second layers are structurally in communication with support means for supporting the first and second layers in a fixed spaced relationship separated by a gap from one another. As will be described hereinbelow in greater detail, the interlayer gap may contain air, acrylic resin, or may be evacuated, so as to provide a high index of refraction which affords high reflectivity to the quantum wells. The filler material may be selected to achieve desired results. For example, a thermally conductive filler medium will achieve heat sinking, and a thermally conductive filler medium will lower overall resistivity.

In one embodiment of the invention, the first and second layers are formed of $In_{0.53}Ga_{0.47}As$, and have a thickness of approximately between 80 Å and 200 Å. Also in this embodiment, the support means is configured in the form of a support post formed of InP.

In another embodiment of the invention, the first and second layers are formed of GaAs, and also have a thickness of approximately between 80 Å and 200 Å. The support means in this embodiment is a support post formed of $Al_xGa_{1-x}As$. The first and second layers are separated by a gap of approximately between 100 Å and 2500 Å.

In accordance with a laser structure aspect of the invention, a laser is formed as a Fabry-Perot cavity which produces a laser emission. First and second mirror structures arranged on each side of the laser means and separated therefrom by a gap. In accordance with a preferred embodiment of the invention, the gap is occupied with air or an acrylic resin, or may be evacuated substantially to a vacuum. As previously noted, other filler materials may be employed in the practice of the invention.

In one embodiment of this laser structure aspect of the invention, the first and second mirror structures are each formed of first and second semiconductor layers separated from one another by a gap. Each of the mirror structures is, in the preferred embodiment, arranged as a Bragg mirror, and the first and second semiconductor layers are each formed of GaAs.

In a further embodiment of this laser aspect of the invention, the laser structure is formed as a Fabry-Perot cavity having a gain quantum well therein. The laser structure is formed of first and second GaAs layers arranged with a layer of $In_{0.3}Ga_{0.7}As$ therebetween. Low threshold, single mode surface emitting lasers.

In accordance with a Bragg mirror aspect of the invention, a Bragg mirror structure is provided with a first layer of GaAs for forming a first quantum well and a second layer of GaAs for forming a second quantum well. A support element is provided for supporting the first and second layers in a fixed spaced relationship separated by a gap from one another, and electrodes are coupled electrically to the first and second layers for facilitating application of an electric field thereto.

In a preferred embodiment of this Bragg mirror aspect of the invention, the first and second layers are each provided with n-type doping on a first surface thereof, and p-type doping on a second surface thereof. Such doping facilitates the application of an electric field which, as will be discussed hereinbelow in detail, facilitates the tuning of the Bragg mirror. In this embodiment, the electric field applied to the first and second layers via the electrodes are perpendicular to the surfaces of the first and second layers.

In other embodiments, the electric field applied to the first and second layers in response to the electrode means is arranged parallel to the surfaces of the first and second layers. Doping may not be necessary in such an arrangement, if deep implants are made. The support posts may be doped to facilitate parallel field modulation or current injection into the quantum wells. Also, the top and bottom layers, or other selected layers, may be doped to facilitate perpendicular field modulation or current injection into the quantum wells.

In accordance with a method aspect of the invention, a method of forming a semiconductor quantum well lattice having high reflectivity, the method includes the steps of:

epitaxially growing on a substrate a plurality of layers of crystalline material as a superlattice, periodic ones of the layers of crystalline material constituting respective quantum wells;

transferring a mask pattern to the epitaxially grown superlattice;

etching to expose the superlattice; and selectively etching sidewalls of the superlattice to bare the quantum wells.

In one embodiment of this method aspect, the substrate is formed of GaAs (100) and the crystalline material is GaAs/Al$_x$Ga$_{1-x}$As. In addition, the step of epitaxially growing comprises the step of employing a selectable one of molecular beam epitaxy or metal-organic vapor phase epitaxy. However, any of a number of known epitaxial growth techniques can be employed in the practice of the invention, the selection thereof being within the ability of a person of ordinary skill in the art.

The substrate, in another embodiment, is formed of InP (100) and the crystalline material is In$_{0.53}$Ga$_{0.47}$As/InP. Here, the step of epitaxially growing includes the step of employing metal-organic vapor phase epitaxy. However, as previously indicated, persons of skill in the art select any of a number of other epitaxial growth techniques in the practice of the invention.

BRIEF DESCRIPTION OF THE DRAWING

Comprehension of the invention is facilitated by reading the following detailed description, in conjunction with the annexed drawing, in which:

FIGS. 1a, 1b, and 1c constitute a schematic representation of substantially free-standing quantum well fabrication in accordance with the invention, wherein FIG. 1a shows the positive mask pattern which is transferred to an epitaxially grown superlattice structure using photoresist or liftoff processing, FIG. 1b illustrates that the masked material is then anisotropically etched to expose the superlattice, and FIG. 1c illustrates that the exposed sidewalls of the superlattice are selectively etched to bare the quantum wells;

DETAILED DESCRIPTION

Conventional microfabrication techniques in conjunction with the precise growth of layers of single crystalline materials by epitaxial growth techniques allow the creation of new electro-optic microstructures. Compositionally modulated III–V heterostructures are selectively etched to produce quantum wells which are confined on both sides by air, vacuum, or acrylic resin. The use of an acrylic resin to fill the spaces where other material has been etched away serves the further advantageous function of improving the rate of heat transfer away from the quantum wells. Alternative filler materials, such as electrically conductive materials, will lower the overall resistivity of the device.

The material is patterned so as to have the quantum wells suspended horizontally between vertical support posts. This structure is ideal for probing the local properties of solids, e.g., the interaction of quantum confined states with surface or interface states. The inherent high contrast ratio between the barrier and suspended material allows the construction of efficient mirrors. This is of particular interest in that it allows the fabrication of a Fabry-Perot optical resonator cavity with a linear dimension on the order of the spontaneous emission wavelength of the active medium. The satisfaction of this latter criterion limits the emission to a single mode and substantially lowers the emission threshold.

Figure 1A:
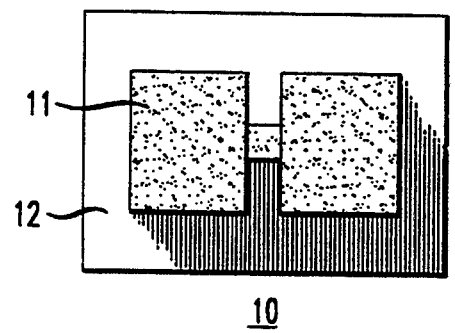
Figure 1B:
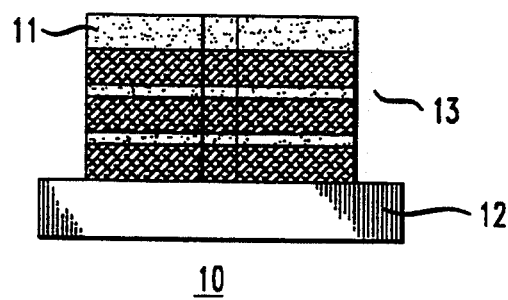
Figure 1C:
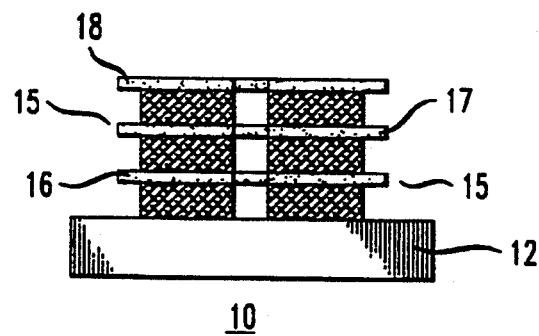

FIGS. 1a, 1b, and 1c constitute a schematic representation of the sequence of substantially free-standing quantum well fabrication in accordance with the invention. More specifically, FIG. 1a shows a semiconductor structure 10 having a positive mask pattern 11 which is transferred to an epitaxially grown superlattice structure (not specifically shown in this figure) using photoresist or liftoff processing. The superlattice is grown on a substrate 12. FIG. 1b illustrates that masked material 11 is then anisotropically etched to expose superlattice 13. FIG. 1c illustrates that the exposed sidewalls 15 of the superlattice are selectively etched to bare the quantum wells 16, 17, and 18.

These quantum well structures are prepared from both GaAs/Al$_x$Ga$_{1-x}$As and In$_{0.53}$Ga$_{0.47}$As/InP superlattices. The GaAs/Al$_x$Ga$_{1-x}$As superlattices are grown by both solid source molecular beam epitaxy (MBE) and metal-organic vapor phase epitaxy (MOVPE) on GaAs (100) substrates. The In$_{0.53}$Ga$_{0.47}$As/InP superlattices are grown by MOVPE on InP (100) substrates. In either case, persons of ordinary skill in the art can select and apply any of a number of other known epitaxial growth techniques. Well widths from approximately 80 to approximately 200 Å with variable spacings from approximately 100 to approximately 2000 Å can be achieved without difficulty.

The MBE grown structures used for this specific experiment are prepared using a 3″ Riber 2300 MBE epitaxial growth system. All samples are prepared for growth with a standard degreasing and etching procedure. The MBE samples are subsequently In-mounted to Mo sample holders. The GaAs growth rate is nominally 0.68 μm/hr and the Al$_x$Ga$_{1-x}$As growth rate varies depending on the Al incorporation. The substrate growth temperature is held at 590° C. during the growth of the epitaxial layers. The GaAs growth rate is determined using reflection high energy electron diffraction oscillations and SEM calibration of bulk layers. The Al composition of the Al$_x$Ga$_{1-x}$As layers is determined using double crystal X-ray diffraction and SEM calibration of bulk layers. All growth structures are nominally undoped, exhibit low p-type doping behavior, and have a ~1 μm GaAs buffer layer grown first.

The MOVPE structures are grown in a Thomas Swan reactor at atmospheric pressure and at a growth temperature of 700° C. for the GaAs/Al$_x$Ga$_{1-x}$As system and at 625° C. for In$_{0.52}$Ga$_{0.48}$As/InP. Trimethyl alkyls are used for the Ga, In and Al sources and pure arsine and phosphine are used as hydride sources. The growth rate for the InP is 5 Å/sec and 10 Å/sec for both the In$_{0.53}$Ga$_{0.47}$As and GaAs species. The Al$_x$Ga$_{1-x}$As growth rate varies with the Al incorporation (15 Å/sec for Al$_{0.30}$Ga$_{0.70}$As) as with the MBE grown material. The GaAs/Al$_x$Ga$_{1-x}$As structures are grown continuously with no growth interruptions. A one second phosphine purge is used after the $In_{0.53}Ga_{0.47}As$ layer to remove excess As prior to the deposition of the subsequent InP layer for the InGaAs/InP structure. No purge is used from InP to the next $In_{0.53}Ga_{0.47}As$ layer. The growth rates are determined by selective wet chemical etching to form steps which were measured by mechanical depth profiling.

After growth, conventional optical or e-beam lithography (depending on the surface area of the desired feature) is employed to pattern AZ-4110 photoresist or 1500 Å thick Ni liftoff masks. Structures with quantum well surface area greater than 0.5 $\mu m^2$ are typically defined optically.

FIG. 1a shows a typical pattern that is used in the practice of the invention. The patterned wafer is anisotropically etched with reactive ions to define a mesa (or trench) with relatively straight side walls in a MRC model RIE-51 etcher. The wafer is etched at an RF voltage of 200 V with a 5 mTorr mixture of dichlorodifluoromethane and He at flow rates of 7.5 sccm each. The InP ($Al_xGa_{1-x}As$) spacer layers are then selectively etched away to expose the $In_{0.53}Ga_{0.47}As$ (GaAs) quantum wells. HCl and HF are excellent selective etches for the two systems presented here, respectively. It has been learned, however, that the generation of hydrogen bubbles tend to buckle the structures. Other known enchants eliminate this problem and allow more control over the etch rates. However, this generally is achieved with a loss in selectivity.

The area of the supporting pads is chosen judicially such that sufficient area is left in the pad after the selective etch to support the structure. The minimum ratio of the supporting pad area to that of the suspended $In_{0.53}Ga_{0.47}As$ quantum well is about 130:1 when HCl is used.

These structures are very robust. No special care needs to be taken to inhibit damage due to surface tension exerted during drying following wet etch processing. The primary failure mechanism is over etching of the spacer layers in the support posts. This phenomenon is particularly evident in multiple quantum well structures taller than 1 $\mu m$ and is a consequence of sloping sidewalls. The quantum wells at the base of these structures have more surface area than those at the top and require a longer time interval to expose the wells. Unfortunately, this longer time interval results in the erosion of the upper supporting spacer layers. Partial compensation for this problem in the GaAs quantum well is achieved by grading the stoichiometry of the spacer layers.

Figure 2:
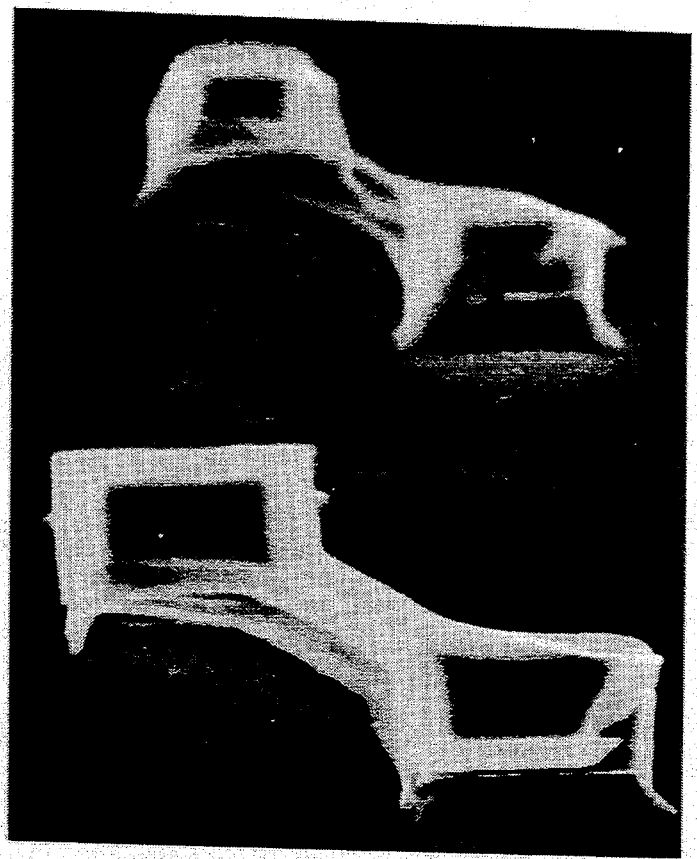
FIG. 2 is a scanning electron micrograph of two structures of substantially free-standing In$_{0.53}$Ga$_{0.47}$As quantum wells suspended between two post structures, the quantum wells being 200 Å and 80 Å thick from top to bottom, respectively, and separated by a gap of 2000 Å.

A scanning electron microscope micrograph of an $In_{0.53}Ga_{0.47}As$ (GaAs) quantum well structure is shown in FIG. 2. In this figure, two structures of substantially free-standing $In_{0.53}Ga_{0.47}As$ quantum wells are suspended between two post structures, the quantum wells being 200 Å and 80 Å thick from top to bottom, respectively, and separated by a gap of 2000 Å. The dark contrast areas of the structures delineate the support posts. The breadth of the quantum wells in the foreground is 0.5 $\mu m$. The damaged structure in the background is smaller and shows the effects of over etching.

Figure 3:
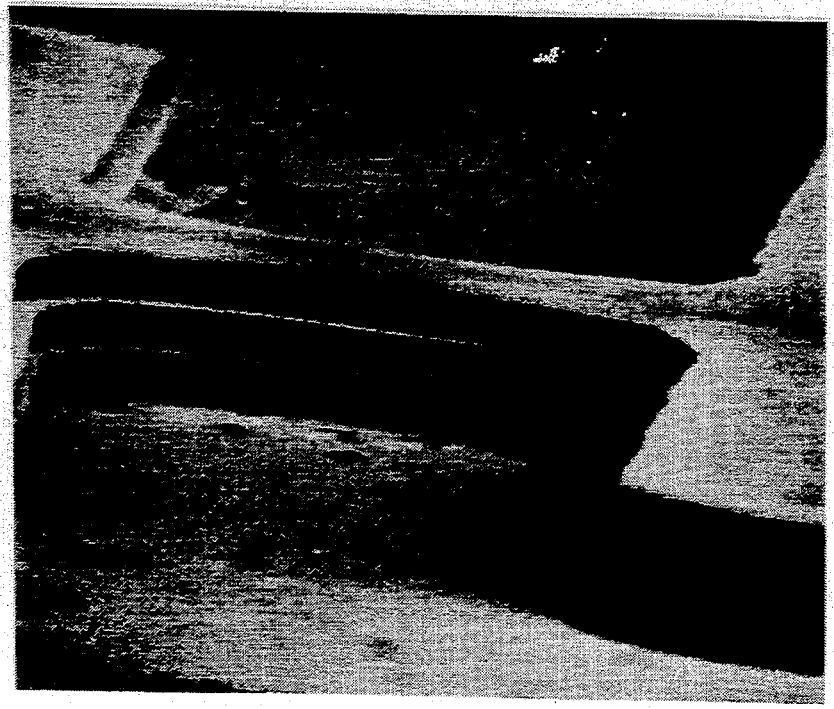
FIG. 3 is a scanning electron micrograph which shows three GaAs quantum wells which are 200 Å thick and are separated by 2000 Å.

FIG. 3 is a micrograph which shows three GaAs quantum wells which are 200 Å thick and are separated by 2000 Å.

In summary, the inventors herein have demonstrated the fabrication of a novel quantum well structure using conventional fabrication techniques on optoelectronic materials grown by standard epitaxial processes. These essentially free standing quantum wells have infinite potential barriers under vacuum conditions and will provide a basis for the study of new physics. By way of example, an exciton produced in the inventive structure would be totally confined in the quantum well. Room temperature cathodoluminesence has shown that the luminescence efficiency of the mesa etched GaAs/$Al_xGa_{1-x}As$ structure exceeds that of the underlying GaAs substrate. In addition, it is now possible, in light of this disclosure, to construct efficient optical cavities with linear dimensions on the order of the wavelength of the active media.

Although the invention has been described in terms of specific embodiments and applications, persons skilled in the an can, in light of this teaching, generate additional embodiments without exceeding the scope or departing from the spirit of the claimed invention. Accordingly, it is to be understood that the drawing and description in this disclosure are proffered to facilitate comprehension of the invention, and should not be construed to limit the scope thereof.

What is claimed is:

1. A semiconductor structure comprising:
   a first layer for forming a first quantum well;
   a second layer for forming a second quantum well; and
   support means for supporting said first and second layers in a fixed spaced relationship separated by a gap of approximately between 100 Å and 2500 Å from one another.

2. The semiconductor structure of claim 1 wherein said first and second layers are formed of $In_{0.53}Ga_{0.47}As$, and have a thickness of approximately between 80 Å and 200 Å.

3. The semiconductor structure of claim 2 wherein said support means comprises a support post formed of InP.

4. The semiconductor structure of claim 1 wherein said first and second layers are formed of GaAs, and have a thickness of approximately between 80 Å, and 200 Å.

5. The semiconductor structure of claim 4 wherein said support means comprises a support post formed of $Al_xGa_{1-x}As$.

6. A laser structure comprising:
   laser means formed as a Fabry-Perot cavity for producing a laser emission; and
   first and second mirror structures arranged on each side of said laser means and separated therefrom by a gap.

7. The laser structure of claim 6 wherein said first and second mirror structures are each formed of first and second semiconductor layers separated from one another by a gap.

8. The laser structure of claim 7 wherein each of said mirror structures comprises a Bragg Mirror, and said first and second semiconductor layers are each formed of GaAs.

9. The laser structure of claim 6 wherein said laser means is formed as a Fabry-Perot Cavity having a gain quantum well therein.

10. The laser structure of claim 9 wherein said laser means is formed of first and second GaAs layers arranged with a layer of $In_{0.3}Ga_{0.7}As$ therebetween.

11. A Bragg mirror structure comprising:
   a first layer of GaAs for forming a first quantum well;
   a second layer of GaAs for forming a second quantum well;

support means for supporting said first and second layers in a fixed spaced relationship separated by a gap from one another; and electrode means coupled electrically to said first and second layers for facilitating application of an electric field to said first and second layers.

12. The Bragg mirror structure of claim 11 wherein said first and second layers are each provided with n-type doping on a first surface thereof, and p-type doping on a second surface thereof.

13. The Bragg mirror structure of claim 12 wherein said electric field applied to said first and second layers in response to said electrode means is arranged perpendicular to said surfaces of said first and second layers.

14. The Bragg mirror structure of claim 11 wherein said electric field applied to said first and second layers in response to said electrode means is arranged parallel to said surfaces of said first and second layers.

15. A method of forming a semiconductor quantum well lattice having high reflectivity, the method comprising the steps of:

epitaxially growing on a substrate a plurality of layers of crystalline material as a superlattice, periodic ones of said layers of crystalline material constituting respective quantum wells;

transferring a mask pattern to the epitaxially grown superlattice;

etching to expose the superlattice; and selectively etching sidewalls of the superlattice to bare the quantum wells.

16. The method of claim 15 wherein said substrate is formed of GaAs (100) and said crystalline material is $GaAs/Al_xGa_{1-x}As$.

17. The method of claim 16 wherein said step of epitaxially growing comprises the step of employing one of molecular beam epitaxy or metal-organic vapor phase epitaxy.

18. The method of claim 15 wherein said substrate is formed of InP (100) and said crystalline material is $In_{0.53}Ga_{0.47}As/InP$.

19. The method of claim 15 wherein said step of epitaxially growing comprises the step of employing metal-organic vapor phase epitaxy.

* * * * *